(12) United States Patent
Zuniga et al.

(10) Patent No.: US 6,384,486 B2
(45) Date of Patent: *May 7, 2002

(54) BONDING OVER INTEGRATED CIRCUITS

(75) Inventors: Edgar R. Zuniga; Samuel A. Ciani, both of Sherman, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/458,593

(22) Filed: Dec. 10, 1999

Related U.S. Application Data

(60) Provisional application No. 60/112,529, filed on Dec. 15, 1998.

(51) Int. Cl.[7] .............................................. H01L 23/48
(52) U.S. Cl. ........................ 257/781; 257/780; 257/785
(58) Field of Search ............................... 257/780, 781, 257/785

(56) References Cited

U.S. PATENT DOCUMENTS

| | | | |
|---|---|---|---|
| 5,367,195 A | * | 11/1994 | DiGiacomo et al. ........ 257/767 |
| 5,442,239 A | * | 8/1995 | DiGiacomo et al. ........ 257/781 |
| 5,502,337 A | * | 3/1996 | Nozaki ........................ 257/773 |
| 5,565,378 A | * | 10/1996 | Harada et al. ............... 257/780 |
| 5,719,448 A | * | 2/1998 | Ichikawa et al. ............ 257/781 |
| 5,736,791 A | * | 4/1998 | Fujiki et al. ................ 257/781 |
| 5,751,065 A | * | 5/1998 | Chittipeddi et al. ......... 257/758 |
| 5,847,466 A | * | 12/1998 | Ito et al. ..................... 257/775 |
| 5,923,088 A | * | 7/1999 | Shiue et al. ................. 257/758 |
| 5,965,903 A | * | 10/1999 | Chittipeddi et al. ......... 257/758 |
| 6,016,000 A | * | 1/2000 | Moslehi ...................... 257/522 |
| 6,031,293 A | * | 2/2000 | Hsuan et al. ................ 257/781 |

* cited by examiner

*Primary Examiner*—Eddie Lee
*Assistant Examiner*—Lourdes Cruz
(74) *Attorney, Agent, or Firm*—Gary C. Honeycutt; Fred Telecky; Arthur I. Navarro

(57) ABSTRACT

An architecture and method of fabrication for an integrated circuit 200 having a bond pad 208; at least one portion of said integrated circuit disposed under said contact pad and electrically connected to said pad through a via 205; a combination of a bondable metal layer 207, a stress-absorbing metal layer 203, and a mechanically strengthened, electrically insulating layer 204; and said combination of layers separating said contact pad and said portion of said integrated circuit, and having sufficient thickness to protect said circuit from bonding impact.

17 Claims, 2 Drawing Sheets

BONDING OVER INTEGRATED CIRCUITS

This application claims priority under 35 USC §119 based upon Provisional Patent Application No. 60/112,529, filed Dec. 15, 1998.

FIELD OF THE INVENTION

The present invention is related in general to the field of semiconductor devices and processes, and more specifically to integrated circuits that permit wire bonding to be performed directly over portions of the active circuit area.

DESCRIPTION OF THE RELATED ART

Two independent trends in semiconductor technology, both with a long history, contribute to the urgency for the present invention. The first trend concerns aspects of manufacturing cost savings by conserving semiconductor "real estate".

In order to accommodate balls of bonding wires or solder, typical bonding pads on silicon integrated circuits ICs) have to be of sufficient size; they typically range from squares of 80×80 μm to squares of 150×150 μm. They consume, therefore, an area between approximately 1 and 20% of the circuit area, dependent on the number of bonding pads and the size of the integrated circuit. For manufacturing and assembly reasons, the bonding pads are arranged in rows along the periphery of the circuit, usually stringed along all four chip sides.

Until now, all semiconductor devices manufactured had to exclude the area covered by the bonding pads from use for laying out actual circuit patterns because of the high risk of damaging the circuit structures due to the unavoidable forces needed in the bonding process. Evidently, considerable savings of silicon real estate can be obtained if circuit patterns could be allowed to be laid out under the bonding pad metal. One way to achieve this would be to create another level of metallization dedicated solely to bonding pad formation. This level would be built over a protective overcoat covering an active circuit area. In existing technology, however, a special stress buffer layer of polyimide has to be applied between the protective overcoat and the extra metal layer, as shown by K. G. Heinen et al. ("Wire Bonds over Active Circuits", Proc. IEEE 44th Elect. Comp. Tech. Conf., 1994, pp. 922–928). The cost of applying this polyimide layer has so far prohibited the implementation of the bonds-over-active-circuit concept.

Another approach in existing technology has been proposed in U.S. Patent Application No. 60/092,961, filed Jul. 14, 1998 (Saran, "System and Method for Bonding Over Active Integrated Circuits"). In order to make the bonding pads strong enough to withstand the mechanical forces required in the wire bonding process, reinforcing systems under the bonding pad are described which utilize specific portions of the actual IC as the means to reinforce weak dielectric layers under the bonding pad. This method requires specific design or redesign of the IC and is poorly suited for standard linear and logic ICs which often have numerous bonding pads but relatively small circuit areas.

The second trend concerns certain processes in the assembly of a semiconductor chip. It is well known that bonding pads in silicon ICs can be damaged during wafer probing using fine-tip tungsten needles, further during conventional thermosonic wire bonding to aluminum metallization on the circuits, or during solder ball attachment in chip-to-substrate devices of more recent assembly developments. In wire bonding, particularly suspect are the mechanical loading and ultrasonic stresses applied the tip of the bonding capillary to the bonding pad. When the damage is not apparent during the bonding process, the defects may manifest themselves subsequently by succumbing to thermo-mechanical stresses generated during the plastic encapsulation, accelerated reliability testing, temperature cycling, and device operation. The damage appears in most cases as microcracks which may progress to fatal fractures in the underlying dielectric material, as chip-outs of brittle or mechanically weak dielectric films, often together with pieces of metal or silicon, or as lifted ball bonds, or as delamination of metal layers.

Recent technological developments in the semiconductor technology tend to aggravate the problem. For instance, newer dielectric materials such as silicon-containing hydrogen silsesquioxane (HSQ) are being preferred due to their lower dielectric constant which helps to reduce the capacitance C in the RC time constant and thus allows higher circuit speeds. Since lower density and porosity of dielectric films reduce the dielectric constant, films with these characteristics are introduced even when they are mechanically weaker. Films made of aerogels, organic polyimides, and parylenes fall into the same category. These materials are mechanically weaker than previous standard insulators such as the plasma-enhanced chemical vapor deposited dielectrics. Since these materials are also used under the bonding pad metal, they magnify the risk of device failure by cracking.

In addition, the spacing between bonding pads is being progressively reduced to save valuable silicon real estate. Consequently, the bonding parameters have to become more aggressive to achieve stronger bonds in spite of the smaller size. Bonding force and ultrasonic energy during bonding are being increased. Again, the risk of yield loss and lowered reliability is becoming greater.

For conventional bonding pad metallization processes, a solution to the aforementioned problems was disclosed in U.S. patent application Ser. No. 08/847,239, filed May 1, 1997 (Saran et al., "System and Method for Reinforcing a Bond Pad"). Some concepts and methods of this disclosure have been subsequently described by M. Saran et al. in a publication entitled "Elimination of Bond-pad Damage through Structural Reinforcement of Intermetal Dielectrics" (Internat. Reliab. Physics Symp., March 1998). In essence, a metal structure designed for mechanical strength serves as a reinforcement for the mechanically weak dielectric layer. The metal is deposited and then etched to form "reservoirs" to be filled with the dielectric material, for example HSQ. Since HSQ is deposited by a spin-on process, the sizes of the reservoirs have to remain large enough to be filled controllably with the dielectric. This requirement is contrary to the industry trend for continued shrinking of all circuit feature sizes.

When the insulator film is formed first, openings such as trenches are etched into this film; metal such as copper or aluminum is then deposited to fill these openings, while metal deposited elsewhere on the surface is removed grinding and polishing (so-called damascene metallization process). Wire bonding and solder ball flip-chip bonding over damascene metal pads are facing the same risks of cracking weak dielectric layers as in the case of conventional metallization. U.S. Patent Application No. 60/085, 876, filed May 18, 1998 (Saran et al., "Fine Pitch System and Method for Reinforcing Bond Pads in Semiconductor Devices") teaches the design and fabrication process for metal structures made with the damascene technique reinforcing weak dielectrics under the bonding pads.

An urgent need has therefore arisen for a low-cost, reliable mass production system and method providing the manufacture of wire and solder ball bonds directly over active IC areas. The system should provide stress-free, simple, and no-cost-added contact pads for flexible, tolerant bonding processes even when the contact pads are situated above one or more structurally and mechanically weak dielectric layers. The system and method should be applicable to a wide spectrum of design, material and process variations, leading to significant savings of silicon, as well as to improved process yield and device reliability. Preferably, these innovations should be accomplished using the installed process and equipment base so that no investment in new manufacturing machines is needed.

SUMMARY OF THE INVENTION

According to the present invention for semiconductor integrated circuits (ICs), at least a portion of a contact pad can be positioned over the IC, when a combination of a bondable metal layer, a stress-absorbing metal layer, and a mechanically strengthened, electrically insulating layer, separate the contact pad and the portion of the IC, provided that each layer has sufficient thickness. This combination of layers and thicknesses provides a system strong enough to withstand the mechanical forces required in the bonding process.

The present invention is related to high density ICs, especially those having high numbers of metallized inputs/outputs, or contact pads. These circuits can be found in many semiconductor device families such as standard linear and logic products, processors, digital and analog devices, high frequency and high power devices, and both large and small area chip categories. The invention saves significant amounts of silicon real estate and thus permits the shrinking of IC chips. Consequently, the invention helps to alleviate the space constraints of continually shrinking applications such as cellular communications, pagers, hard disk drives, laptop computers and medical instrumentation.

The invention utilizes the materials and the sequence of processing steps applied to producing the IC. The metals and dielectric offering high stress-absorbing characteristics are applied as layers of sufficient thickness. No extra layers of stress-absorbing materials such as polyimides are needed.

It is an object of the present invention to reduce the cost of IC chips by reducing the silicon area consumed for the overall circuit design. This object is achieved through utilizing the areas underneath the (numerous) contact pads by positioning portions of the actual circuit under the bond pad areas while simultaneously exploiting the metal and insulating layers separating the contact pad and the circuit portions for functions in the circuit design.

Another object of the present invention is to advance the process and operation reliability of semiconductor probing, and wire bonded and solder-attached assemblies by providing the metal and insulating layers separating the contact pad and the circuit portions in thicknesses sufficient to reliably absorb mechanical, thermal and impact stresses.

Another object of the invention is to eliminate restrictions on the processes of probing and of wire bonding and solder attachment, thus minimizing the risks of inflicting cracking damage even to very brittle circuit dielectrics.

Another object of the invention is to provide design and layout concepts and process methods which are flexible so that they can be applied to many families of semiconductor IC products, and are general, so that they can be applied to several generations of products.

Another object of the invention is to provide a low-cost and high-speed process for fabrication, testing and assembly.

Another object of the invention is to use only design and processes most commonly used and accepted in the fabrication of IC devices, thus avoiding the cost of new capital investment and using the installed fabrication equipment base.

These objects have been achieved by the teachings of the invention concerning design concepts and process flow suitable for mass production. Various modifications have been successfully employed so satisfy different selections of product geometries and materials.

In one embodiment of the invention, at least one portion of the IC is disposed under the contact pad, occupying a substantial area under the contact pad. This concept is applied to circuit designs employing two or more levels of metal. In this embodiment, the layer of bondable metal is preferably copper-doped aluminum about 1400 nm thick; the stress-absorbing metal is preferably titanium-tungsten alloy about 300 nm thick; and the mechanically strengthened, electrically insulating layer is preferably silicon nitride about 1000 nm thick. For the layer of bondable metal, aluminum can be substituted by copper, preferably about 1500 nm thick. Examples for suitable circuit portions under the contact pad include resistors, interconnectors, electrostatic discharge structures, inductors, and capacitors. In addition, transistors (preferably CMOS transistors) may be placed under the contact pad.

In another embodiment of the invention, the electrically insulating layer further serves as the protective overcoat of the IC, since it is made of moisture-impenetrable silicon nitride. In addition, the bondable metal layer and the stress-absorbing metal layer further serve as the metallization of the contact pad. The thicknesses of the combination of layers are optimized for the thermal, impact and ultrasonic stresses encountered in wire ball bonding.

In another embodiment of the invention, the bondable metal layer is further modified to include an interface metal layer of, for example, nickel, and a solderable metal layer of, for example gold, palladium or platinum. The thicknesses of the combination of layers are optimized for the reflow stresses encountered in solder attachment.

In another embodiment of the invention, the relative positions of the via, connecting the contact pad and the circuit, and the bonding wire ball are varied in order to ascertain the insensitivity of the system and the process with respect to the stresses associated with the different positions.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to the input/output (I/O) terminals of integrated circuits (ICs), commonly referred to as "contact pads". When wire bonding is used in the assembly of IC chips, these pads are also referred to as "bonding pads" or "bond pads". As defined herein, the term "contact pad" refers to the metallized I/Os of the circuits. A contact pad suitable for a metal ball in wire bonding or for a solder ball in reflow assembly requires a substantial area of semiconductor (usually silicon) "real estate" (from squares of 80×80 μm to squares of 150×150 μm). In modern circuits, the signal, power and ground connections need numerous contact pads, ranging in number from 8 to over 1000, causing a significant sacrifice of precious silicon.

The processes of wire bonding and solder reflow exert considerable mechanical stress onto the contact pads and their underlying materials so that especially insulator layers may be threatened by microcracks. The present invention solves both the area and the strength problems of the circuit contact pads.

Figure 1:
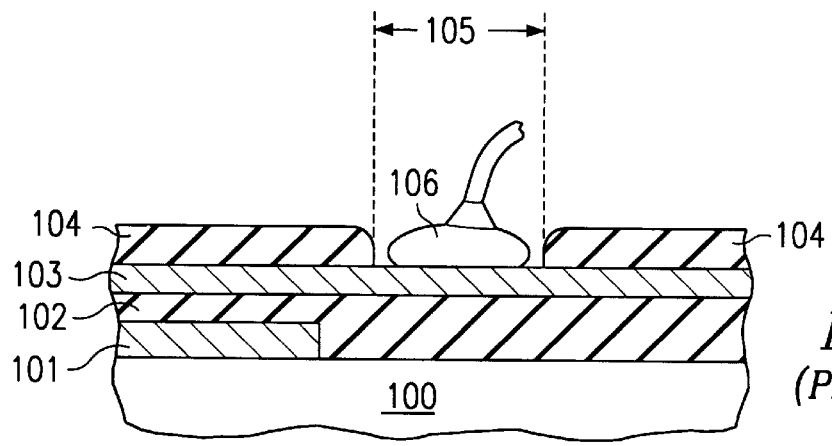
FIG. 1 is a schematic and simplified cross sectional view of the contact pad positioning (with bonding wire ball attached) in the known art.

The impact of the present invention can be most easily appreciated by highlighting the shortcomings of the known technology. FIG. 1 illustrates schematically an example of the standard contact pad arrangement as practiced in known technology, for a double-level metal silicon IC. Over the silicon substrate 100 and a first silicon dioxide layer (not shown), the first metal layer 101 is deposited and patterned as required by the IC design. In most ICs, this metal layer is thin (typically about 450 nm) and made of aluminum, usually doped with up to 2% copper. The interlevel oxide 102 ( typically 800 nm made of silicon dioxode or combinations of insulating layers including HSQ or other materials of low dielectric constant) is followed by the second metal layer 103, usually made of aluminum doped with up to 2% copper ( more recently also made of copper), with thicknesses typically ranging from 0.5 to 1.0 μm. Layer 103, in turn, is topped by the protective overcoat layer 104, usually made of silicon nitride, about 1 μm thick). In this overcoat 104, a window 105 is opened in order to expose the underlying metal so that it can serve as a contact pad. Window 105 has typically a width of 100 μm, resulting in a contact pad area of 100×100 μm² (in some devices, the area is as large as 150×150 μm²). In the example of FIG. 1, the contact pad is used for attaching a bonding wire ball 106; most frequently, wire and ball are made of gold, less frequently of copper.

Experience of many years has shown that the process of wire bonding exerts considerable stress onto the underlying layers of metal and insulators. Main contributors to the challenge of this process step are the impact of the bonding capillary (to flatten the gold ball and form the nailhead contact), the frequency and energy of the ultrasonic agitation of the capillary and the gold ball (to break through the aluminum oxide film on the surface of the exposed metal layer 103), and the time and temperature of the process (to initiate the formation of the intermetallic compounds of the gold/aluminum weld). Due to the stress of the wirebonding operation, and also the stresses exerted in multiprobe testing and in device operation after assembly, design rules for the layout of the IC have been established over the years which prohibit circuit structures to be placed in the area under the bonding pad, and also recommend to avoid the use of brittle, mechanically weak dielectric materials. Otherwise, the risk of cracking or cratering the layers under the bonding pad has been found to be acceptably high. Consequently, considerable real estate area of silicon is required just for accommodating the bonding pad.

Figure 2:
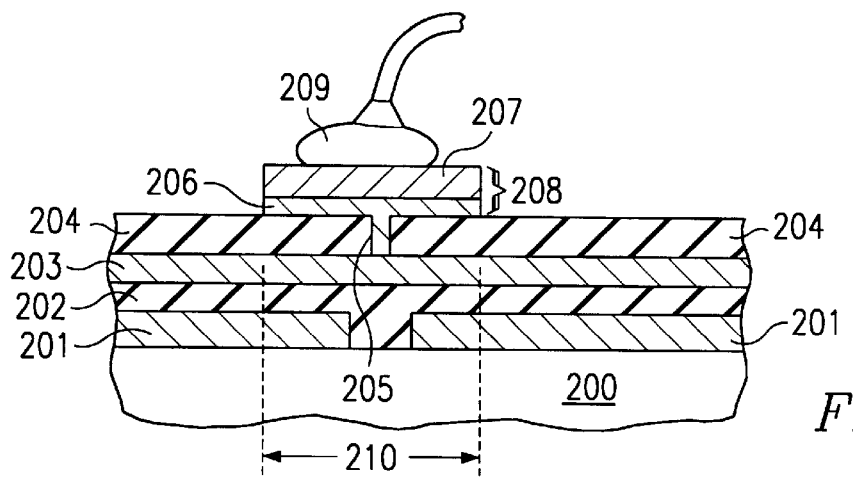
FIG. 2 is a schematic and simplified cross sectional view of a contact pad positioning (with bonding wire ball attached) according to one embodiment of the invention.

The solution to these problems according to the present invention is illustrated in FIG. 2, showing an embodiment for a double-level metal silicon IC. Over the silicon substrate 200 and a first silicon dioxide layer (not shown), the first metal layer 201 is deposited. It is thin (typically about 450 nm), made of aluminum with up to 2% copper, and designed and patterned according to the fine feature sizes of a contemporary IC. Often, layer 201 has a thin underlayer (about 100 to 300 nm) made of refractory metal or alloy.

Metal layer 201 is followed by the interlevel oxide layer 202 (typically 800 nm made of silicon dioxide or combinations of insulating layers including HSQ or other materials of low dielectric constant). The second level metal layer 203 is similar to layer 201, usually somewhat thicker ( about 600 nm).

The protective overcoat layer 204 is usually made of moisture-impenetrable silicon nitride. Other choices include silicon oxynitride, silicon carbon alloys, and sandwiched films thereof. As an important feature of the present invention, the thickness of this layer has to be such that it can contribute to the stress-absorbing characteristic of the hierarchy of layer under the contact pad. Preferably, layer 204 has a thickness of between 1.0 and 1.5 μm, but for some material choices 400 nm may suffice.

As shown in FIG. 2, it is another important feature of the present invention to open only a relatively small via 205 through the overcoat layer 204 (about 20 to 30 μm diameter). It is filled with the refractory metal used for the underlayer 206 of contact pad metal layer 208. Metals used preferably include tungsten, titanium, titanium nitride, or titanium-tungsten alloy; other choices are tantalum, tantalum nitride, tantalum silicon nitride, tungsten nitride, or tungsten silicon nitride.

As for the layer 206, it is a pivotal feature of the present invention that this underlayer made of refractory metal has a thickness large enough to reliably act as a stress-absorbing buffer. Thicknesses between about 200 and 500 nm, preferably about 300 nm, are satisfactory. The thickness for optimum stress absorption depends not only on the selected metal, but also on the deposition technique selected, the rate of deposition, and the temperature of the silicon substrate during the time of deposition, since these parameters determine the microcrystallinity of the deposited layer. It has been found, for instance, that when using sputter deposition of tungsten, the layer formation is preferably performed at a rate of about 4 to 5 nm/s onto a silicon substrate at ambient temperature, increasing to about 70° C. when a thickness of at least 300 nm is reached. The tungsten microcrystals thus created have an average size and distribution such that they act reliably as stress-absorbing "springs" during the wire bonding process in assembly.

The bondable metal layer 207 is usually made of aluminum with up to 2% copper, in the thickness range from about 500 to 2800 nm, with a preferred thickness of about 1400 to 1500 nm. Further, copper is being used as the bondable metal. In the embodiment of FIG. 2, the contact pad is used for attaching a bonding wire ball 209; most frequently, wire and ball are made of gold, less frequently of copper. When the contact pad metallization 208 should be suitable for solder ball attachment, it usually has a surface of a combination of thin metal layers, such as nickel or chromium followed by gold, palladium or platinum.

With the bonding wire ball 209 (or solder ball, respectively) separated from the underlying IC by the combination of the bondable layer 207 (or solderable layer, respectively), the stress-absorbing layer 206, and the mechanically strengthened, electrically insulating layer 204, the bonding process (or soldering process, respectively) can be performed safely without risk of affecting the IC or damaging or cracking any brittle or mechanically weak layers, especially dielectric layers. It is, therefore, advantageous to keep via hole 205 small and utilize the majority of the contact pad area for placing elements of the IC in the layers 203, 202, and 201 under the contact pad. In FIG. 2, the area gain for this design opportunity is generally designated 210.

Figure 3:
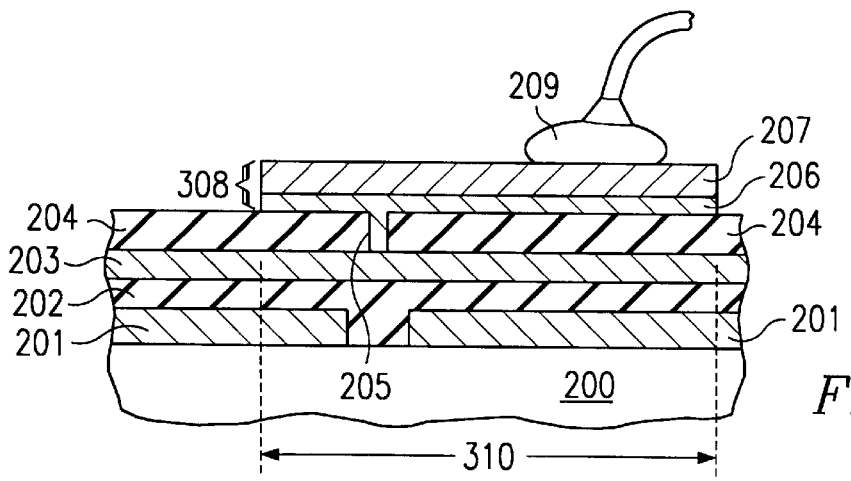
FIG. 3 is a schematic and simplified cross sectional view of a contact pad positioning (with bonding wire ball attached) according to another embodiment of the invention.

FIG. 3 indicates another embodiment of the invention. Shown is schematically a double-level metal IC similar to the IC shown in FIG. 2 (with identical reference numbers indicating corresponding features in both FIGS.) In this embodiment, the combination 308 of metal layers on top of the protective overcoat 204 is extended over a significant portion of the IC surface. This design feature provides the freedom to place the bonding wire ball 209 (or solder ball, respectively) on a location on the IC surface distant from via 205. Consequently, the size of the bonding ball (or solder ball) does no longer have to shrink with the bond pad size, and the placement on the bondable metal is more relaxed since it is no longer confined by tightly controlled precise positioning.

In addition, the opportunity is provided to place more IC elements under the contact pad. These elements may include at least one electrically conductive structure constructed as an interconnector, a resistor, an inductor or a capacitor. Furthermore, the circuit portion may include at least one active component such as a transistor or a diode. In addition, these IC portions may include mechanically weak or brittle dielectric layers. To which extent the available contact pad area is utilized for placing IC components under, is variable according to the specific IC design; the circuit portion may occupy a substantial area under the contact pad.

Figure 4:
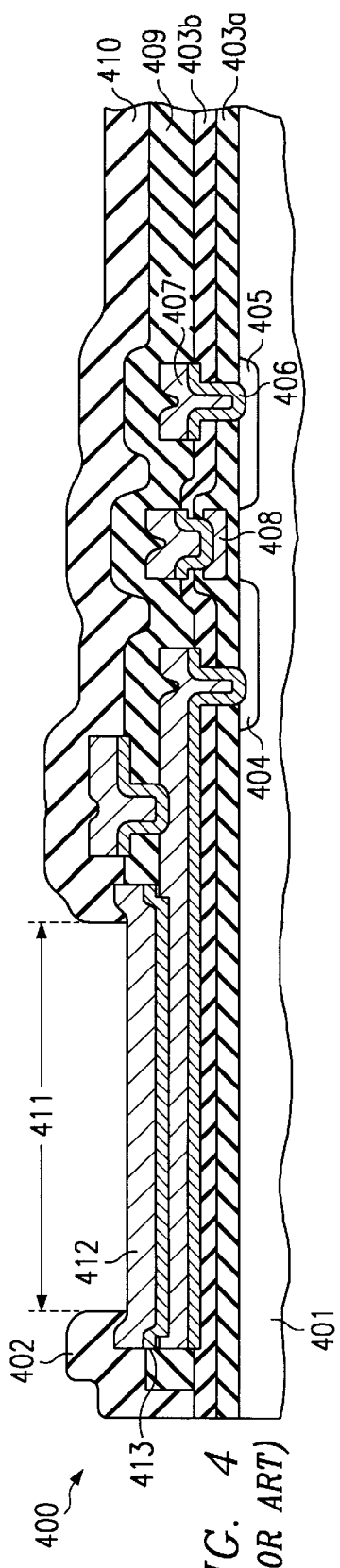
FIG. 4 is a more detailed schematic cross sectional view of a bonding pad positioning in the known art.
Figure 5:
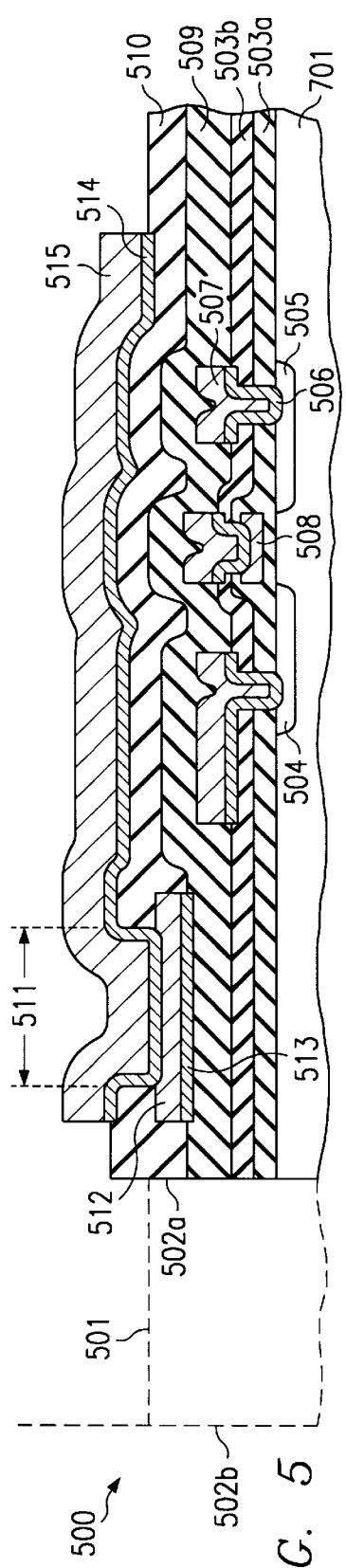
FIG. 5 is a more detailed schematic cross sectional view of a contact pad positioning over a portion of an integrated circuit according to an embodiment of the invention.
Figure 6:
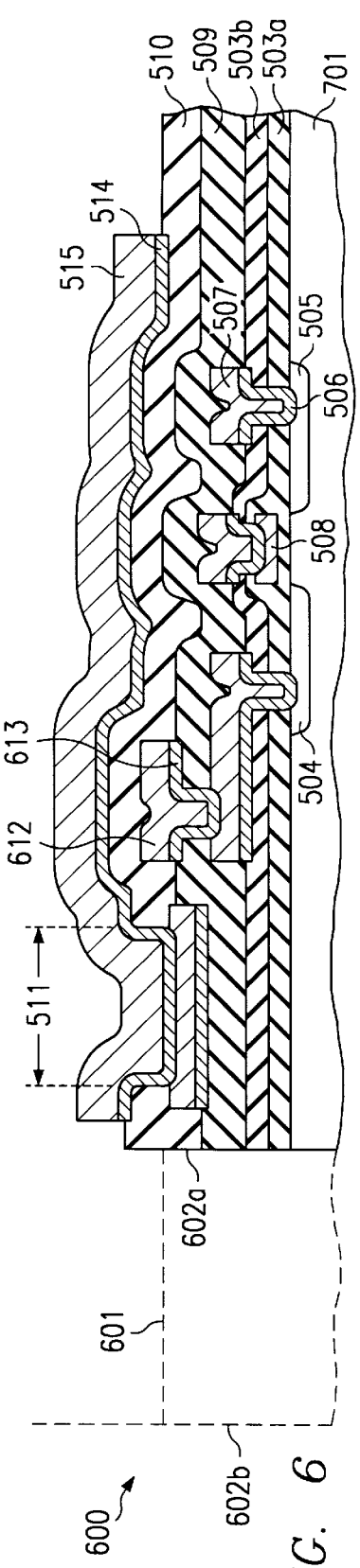
FIG. 6 is a more detailed schematic cross sectional view of a contact pad positioning over a portion of an integrated circuit according to another embodiment of the invention.

This advantage provided by the invention to place active and passive IC components under the contact pad results in significant savings of silicon real estate. The sequence of FIGS. 4, 5 and 6 illustrate this fact by comparing two embodiments of the invention in FIGS. 5 and 6 with the known technology in FIG. 4. FIGS. 4 to 6, although schematic, are drawn to the same relative scale (but not absolute scale) and aligned relative to the chip edges in order to highlight the relative area savings.

FIG. 4 is a cross sectional view of a small portion of a two-level metal IC, generally designated 400, which is fabricated on a silicon substrate 401 and singulated by sawing line 402. Over the silicon, a couple of oxide layers 403a and 403b are shown, which are opened to access the diffusions for source 404 and drain 405 of a CMOS transistor. In these openings, the contacts to source and drain are established by metal level I, represented by the combination of refractory metal 406 (for instance titanium/tungsten) and bondable metal 407 (for instance aluminum). The same metal level is used to contact the gate, represented by polysilicon 408.

Over the interlevel oxide 409 and metal level II is the protective overcoat 410 (for instance silicon nitride). Into this overcoat, the large window 411 (usually a square of 80 to 150 µm side length) is opened to attach a wire bond ball or solder ball to the underlying contact pad metallization. This metallization is provided by metal level II consisting of the refractory metal 412 (preferred thickness about 200 to 500 nm) and the bondable metal 413 (preferred thickness about 1000 to 1500 nm). In the example of FIG. 4, the whole contact pad metallization is in low-resistance and non-rectifying contact with the metal leading to the source of the CMOS transistor displayed; in contrast, other contact pads of the same IC may have dielectric under their areas.

For illustrating the impact of the invention to save silicon real estate area by way of example, the requirements to accommodate the contact pad in the known technology of FIG. 4 are compared with two illustrative embodiments of the invention displayed in FIGS. 5 and 6 for portions of two-level metal ICs (generally designated 500 and 600, respectively) analogous to the IC portion in FIG. 4. The silicon real estate savings are indicated by the distance 501 and 601, respectively, of the actual sawing lines (502a in FIG. 5 and 602a in FIG. 6) to the dashed contours 502b and 602b, respectively, normalized to the sawing lines before the implementation of the teachings of this invention.

As examples for the embodiments of the invention, FIGS. 5 and 6 depict a couple of insulating layers 503a and 503b (fir instance silicon dioxide and other dielectrics described in FIG. 2) deposited over the silicon substrate 701; preferred total thickness of the oxide layers is about 600 to 800 nm. The oxide layers are opened to access the diffusions for source 504 and drain 505 of a CMOS transistor. In these openings, the contacts to source and drain by metal level I, represented by the combination of refractory metal 506 (for instance, titanium/tungsten or titanium nitride, preferred thickness about 200 to 400 nm) and bondable metal 507 (for instance, copper-doped aluminum or copper, preferred thickness about 400 to 800 nm). The same metal level is used to contact the transistor gate, represented by polysilicon 508.

The interlevel dielectric layer 509 (preferred thickness about 600 to 1000 nm) separates metal level I and metal level II. This dielectric layer may contain the mechanically weak but low-dielectric constant materials described in conjunction with FIG. 2; also combinations of dielectric layers are being used. Over the interlevel oxide and metal level II is the protective overcoat 510 (for example, made of moisture-impenetrable, mechanically strengthened silicon nitride or silicon carbide, preferred thickness about 800 to 1200 nm). Similar to metal level I, metal level II consists of a layer of refractory metal (for instance, titanium/tungsten or titanium nitride, preferred thickness about 200 to 400 nm) and a layer of bondable metal (for instance copper-doped aluminum, or copper, preferred thickness about 400 to 800 nm). In FIG. 5, metal level II (designated 512 and 513) is shown to be contacted by the via; in FIG. 6, metal level II (designated 612 and 613) is also shown to contact the source of the CMOS transistor.

It is important for the invention that the IC is designed so that the protective overcoat 510 can retain its mechanically strengthened characteristic; consequently, only a relatively small via 511 (diameter about 20 to 30 µm) is opened into it in order to contact metal level II and thus the IC. This contact is established by the metallization layers 514 and 515 of the actual contact pad, which in FIGS. 5 and 6 is laid out to stretch over a considerable portion of the IC area, including an active component (CMOS transistor) and passive resistors and interconnectors.

It is further important for the invention that layer 514 has stress-absorbing thickness and microcrystallinity. The process detail is described in conjunction with FIG. 2. A good example is a sputter-deposited titanium/tungsten layer of preferably 250 to 350 nm thickness. Another preferred method is chemical vapor deposition. The top metal layer 515, contacted by the connecting gold or copper ball bond, consists of bondable copper-doped aluminum (preferred thickness about 1400 to 1500 nm) forming intermetallics with the bonding wire material. When the connections are established by solder balls, thin layers of solderable metals, such as nickel, gold, palladium or platinum, are deposited on top of the aluminum. The combined layers 514 and 515 have sufficient thickness to protect the underlying circuit components from bonding impact.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An integrated circuit comprising:
   a contact pad; at least one active portion including active circuit elements of said integrated circuit disposed directly under said contact pad and electrically connected to said pad through a via; said pad comprising a combination of a bondable metal layer and
   a stress absorbing refractory metal layer at least 200 nm thick, and a mechanically strengthened, electrically insulating layer under said pad; said combination of layers having sufficient thickness to protect said circuit from bonding impact.

2. The integrated circuit according to claim 1 wherein said circuit portion occupies a substantial area under the contact pad.

3. The integrated circuit according to claim 1 wherein said circuit portion includes at least one electrically conductive structure constructed as an interconnector, a resistor, an inductor or a capacitor.

4. The integrated circuit according to claim 1 wherein said circuit portion includes at least one transistor.

5. The integrated circuit according to claim 1 wherein said circuit portion includes a mechanically weak dielectric layer.

6. The integrated circuit according to claim 1 wherein said bondable metal layer and said stress-absorbing metal layer further serve as the metallization of said contact pad.

7. The integrated circuit according to claim 1 wherein said bondable metal further is solderable.

8. The integrated circuit according to claim 1 wherein said bondable metal is selected from a group consisting of aluminum, aluminum alloy, copper, gold, platinum and palladium.

9. The integrated circuit according to claim 1 wherein said layer of bondable metal is between about 500 and 2800 nm thick.

10. The integrated circuit according to claim 1 wherein said layer of bondable metal is about 1400 to 1500 nm thick.

11. The integrated circuit according to claim 1 wherein said stress-absorbing metal is selected from a group consisting of tungsten, titanium, titanium nitride, molybdenum, chromium, or alloys thereof.

12. The integrated circuit according to claim 1 wherein said layer of stress-absorbing metal is between about 200 and 500 nm thick.

13. The integrated circuit according to claim 1 wherein said layer of stress-absorbing metal is about 300 nm thick.

14. The integrated circuit according to claim 1 wherein said electrically insulating layer further serves as the protective overcoat of said integrated circuit.

15. The integrated circuit according to claim 1 wherein said electrically insulating layer comprises materials selected from a group consisting of silicon nitride, silicon oxynitride, silicon carbon alloys, and sandwiched films thereof.

16. The integrated circuit according to claim 1 wherein said electrically insulating layer is between about 400 and 1500 nm thick.

17. The integrated circuit according to claim 1 wherein said electrically insulating layer is about 1000 nm thick.

* * * * *